(12) United States Patent
Huang et al.

(10) Patent No.: US 7,848,152 B1
(45) Date of Patent: Dec. 7, 2010

(54) METHOD AND SYSTEM FOR ADAPTIVELY FINDING REFERENCE VOLTAGES FOR READING DATA FROM A MLC FLASH MEMORY

(75) Inventors: Chien-Fu Huang, Hsinchu (TW);
Ming-Hung Chou, Hsinchu (TW);
Han-Lung Huang, Hsinchu (TW);
Shih-Keng Cho, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 58 days.

(21) Appl. No.: 12/464,240

(22) Filed: May 12, 2009

(51) Int. Cl.
*G11C 16/04* (2006.01)
(52) U.S. Cl. .............. 365/185.24; 365/185.03; 365/185.2; 365/185.22; 365/185.28; 365/185.29
(58) Field of Classification Search ............ 365/185.03, 365/185.2, 185.22, 185.24, 185.28, 185.29
See application file for complete search history.

(56) References Cited

U.S. PATENT DOCUMENTS

2008/0181010 A1* 7/2008 Chen et al. ............ 365/185.18
2008/0205136 A1* 8/2008 Wang et al. ............ 365/185.03
2008/0263266 A1 10/2008 Sharon et al.
2009/0290426 A1* 11/2009 Moschiano et al. .... 365/185.22

FOREIGN PATENT DOCUMENTS

WO    WO 2008/111058    9/2008

* cited by examiner

*Primary Examiner*—Hoai V Ho
(74) *Attorney, Agent, or Firm*—Squire, Sanders & Dempsey, L.L.P.

(57) ABSTRACT

A method and system for adaptively finding reference voltages for reading data from a multi-level cell (MLC) flash memory is disclosed. According to one embodiment, information about an initial threshold voltage distribution is firstly provided. A first threshold voltage in the initial threshold voltage distribution is then associated with a second threshold voltage in a shifted threshold voltage distribution to be determined, such that the information corresponding to the first threshold voltage is approximate to the information corresponding to the second threshold voltage. Accordingly, initial reference voltage or voltages of the initial threshold voltage distribution are shifted with an amount approximate to difference between the first threshold voltage and the second threshold voltage, thereby resulting in new reference voltage or voltages for reading the data from the MLC flash memory.

13 Claims, 7 Drawing Sheets

METHOD AND SYSTEM FOR ADAPTIVELY FINDING REFERENCE VOLTAGES FOR READING DATA FROM A MLC FLASH MEMORY

BACKGROUND OF THE INVENTION

1. Field of the Invention

The present invention generally relates to multi-level cell (MLC) flash memory, and more particularly to method and system for adaptively finding reference voltages for reading data from the MLC flash memory.

2. Description of the Prior Art

Flash memory is a non-volatile solid state memory device that can be electrically erased and reprogrammed, and is a specific type of electrically erasable programmable read-only memory (EEPROM) device. Conventional flash memory stores a single bit of information in each memory cell such that each memory cell can be programmed to assume two possible states. The conventional flash memory is thus commonly referred to as single-level cell (SLC) flash memory or single-bit cell (SBC) flash memory. Modern flash memory is capable of storing two or more bits of information in each memory cell such that each memory cell can be programmed to assume more than two possible states. The modern flash memory is thus commonly referred to as multi-level cell (MLC) flash memory or multi-bit cell (MBC) flash memory.

In the MLC flash memory, data of different state are written to the flash memory (which is commonly referred as programming the flash memory) by storing different amount of charge in the floating gate of the flash memory. As the charge in the floating gate specifically determines the corresponding threshold voltage, the data can then be read from the MLC flash memory according to their different threshold voltage. Due to variations among the memory cells during the manufacture, operation or according to other factors, the threshold voltage of each state is not a constant value but a range. FIG. 1 shows a common distribution of the threshold voltage for a typical MLC flash memory (a three-bit cell flash memory is exemplified here). The entire voltage range (e.g., Vmin through Vmax) is divided into a number of regions (e.g., eight regions in the example), each region corresponding to one state. The number of cells of each threshold voltage is collected as illustrated. When the flash memory is being read, the threshold voltage of a cell is compared to reference voltages (e.g., $V_1$, $V_2$, etc. in the figure) to determine its state. For example, if the threshold voltage of a cell is within the reference voltages $V_4$ and $V_5$, the "011" state is thus determined and read from the flash memory.

The reference voltages for reading data from the traditional MLC flash memory are constant. In practice, however, the threshold voltage distribution (e.g., the distribution in FIG. 1) may probably change after the flash memory has been subject to a predetermined number of program/erase cycles or/and a predetermined data retention time has elapsed. For example, as shown in FIG. 2 (in which only two states are concerned and shown for illustrative purpose), the initial distribution represented by the (dotted) curve 20 with reference voltage $V_4$ may be suffered from retention issue after a long time not going through program/erase cycle, and therefore drifted downward to a shifted distribution represented by the (solid) curve 22 with a new reference voltage $V_4'$. Errors probably incur if the reference voltage $V_4$ of the initial distribution 20 is still used (while the new reference voltage $V_4'$ is unknown) to read data from the flash memory.

For the reason that conventional MLC flash memory could probably result in read errors due to cycle/retention issue, a need has arisen to propose some novel schemes to obtain proper reference voltages for reading data from the MLC flash memory.

SUMMARY OF THE INVENTION

In view of the foregoing, it is an object of the present invention to provide system and method for effectively and economically finding proper reference voltages for reading data from a MLC flash memory without errors due to cycle/retention issue.

According to one embodiment, an initial threshold voltage distribution is provided that includes data pairs <N,V>, each including normalized number N of cells of the flash memory and corresponding threshold voltage V in the initial threshold voltage distribution. The normalized number N1 of the cells corresponding to a given threshold voltage V1 in a shifted threshold voltage distribution to be determined is obtained. Subsequently, search to find, in the initial threshold voltage distribution, a threshold voltage V2 which has a corresponding normalized number of cells approximate to the number N1. Finally, initial reference voltage or voltages of the initial threshold voltage distribution are shifted with an amount approximate to difference between the threshold voltage V2 and the given threshold voltage V1, thereby resulting in new reference voltage or voltages for reading the data from the MLC flash memory.

According to another embodiment, total number N of cells of the flash memory above a reference threshold voltage of a reference state in an initial threshold voltage distribution is provided. Subsequently, search to find a threshold voltage Va corresponding to a state above which totals number of the cells is approximate to the total number N. Finally, initial reference voltage or voltages of the initial threshold voltage distribution are shifted with an amount approximate to difference between the threshold voltage Va and the reference threshold voltage, thereby resulting in new reference voltage or voltages for reading the data from the MLC flash memory.

DETAILED DESCRIPTION OF THE INVENTION

Figure 1:
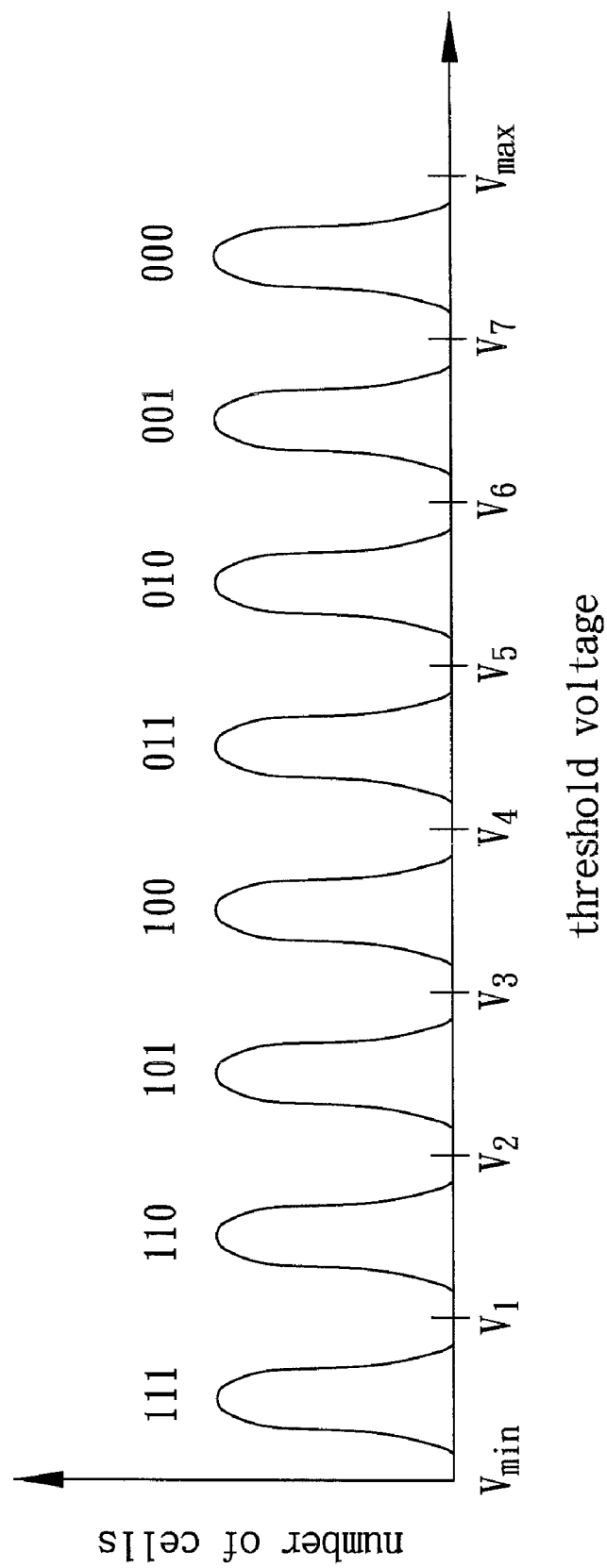
FIG. 1 shows a common distribution of the threshold voltage for a typical MLC flash memory.
Figure 2:
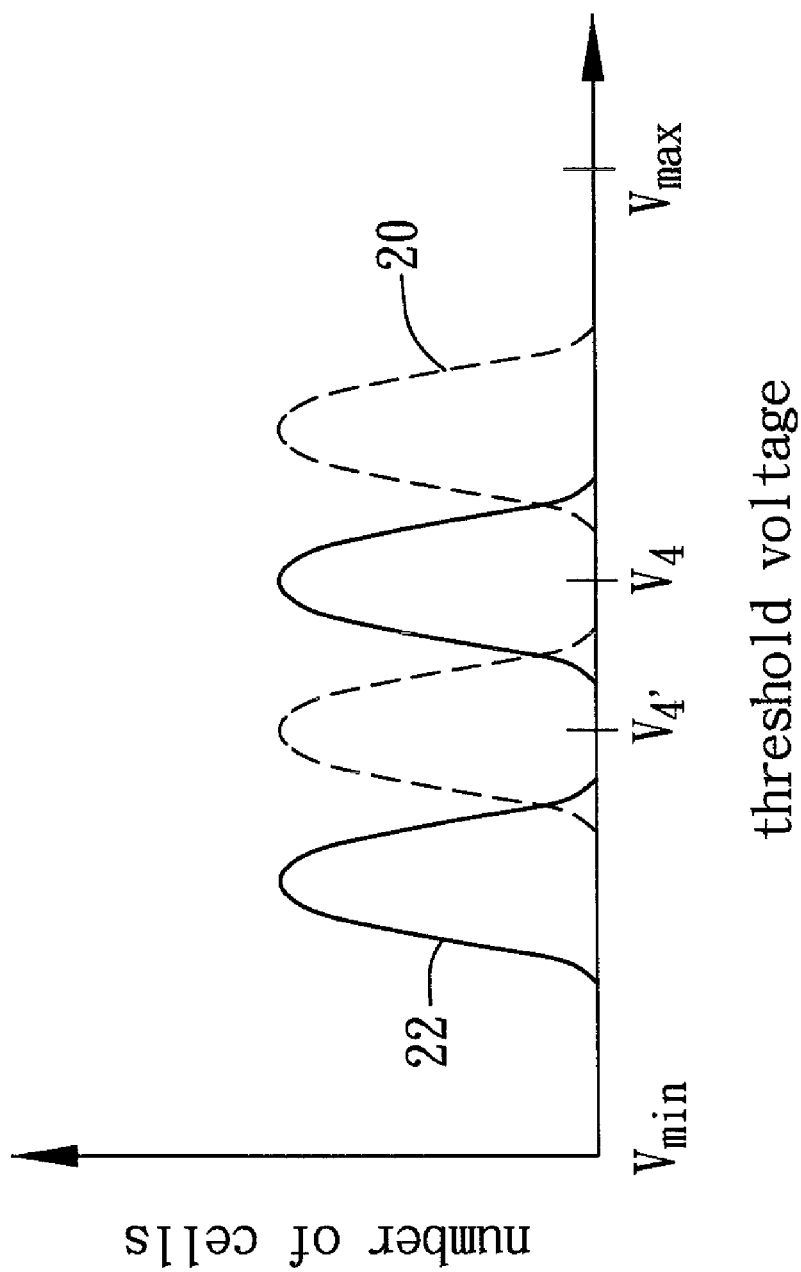
FIG. 2 shows that a portion of the threshold voltage distribution in FIG. 1 changes after the flash memory has been subject to program/erase cycles or/and data retention time has elapsed.
Figure 3A:
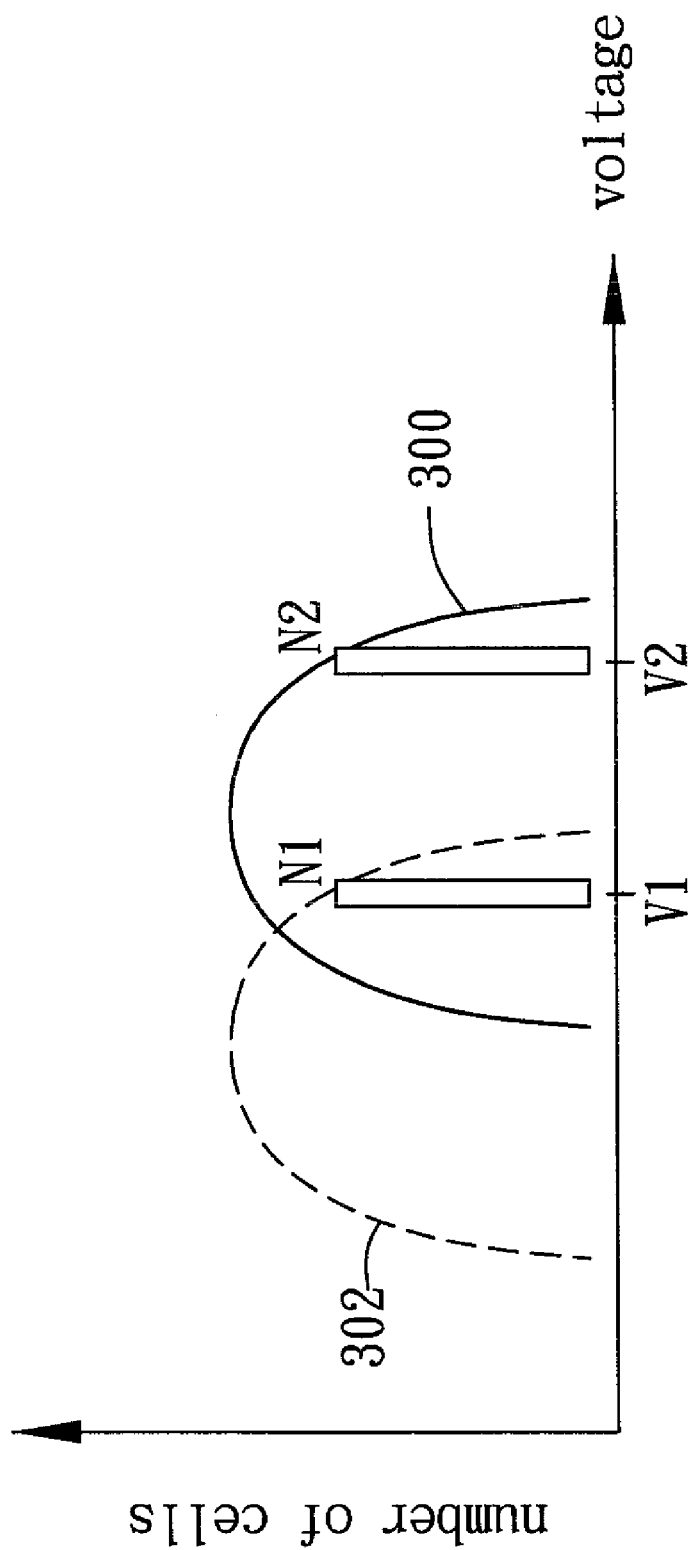
FIG. 3A shows an exemplary threshold voltage distribution of a MLC flash memory, illustrating the aspect according to the first embodiment of the present invention.
Figure 3B:
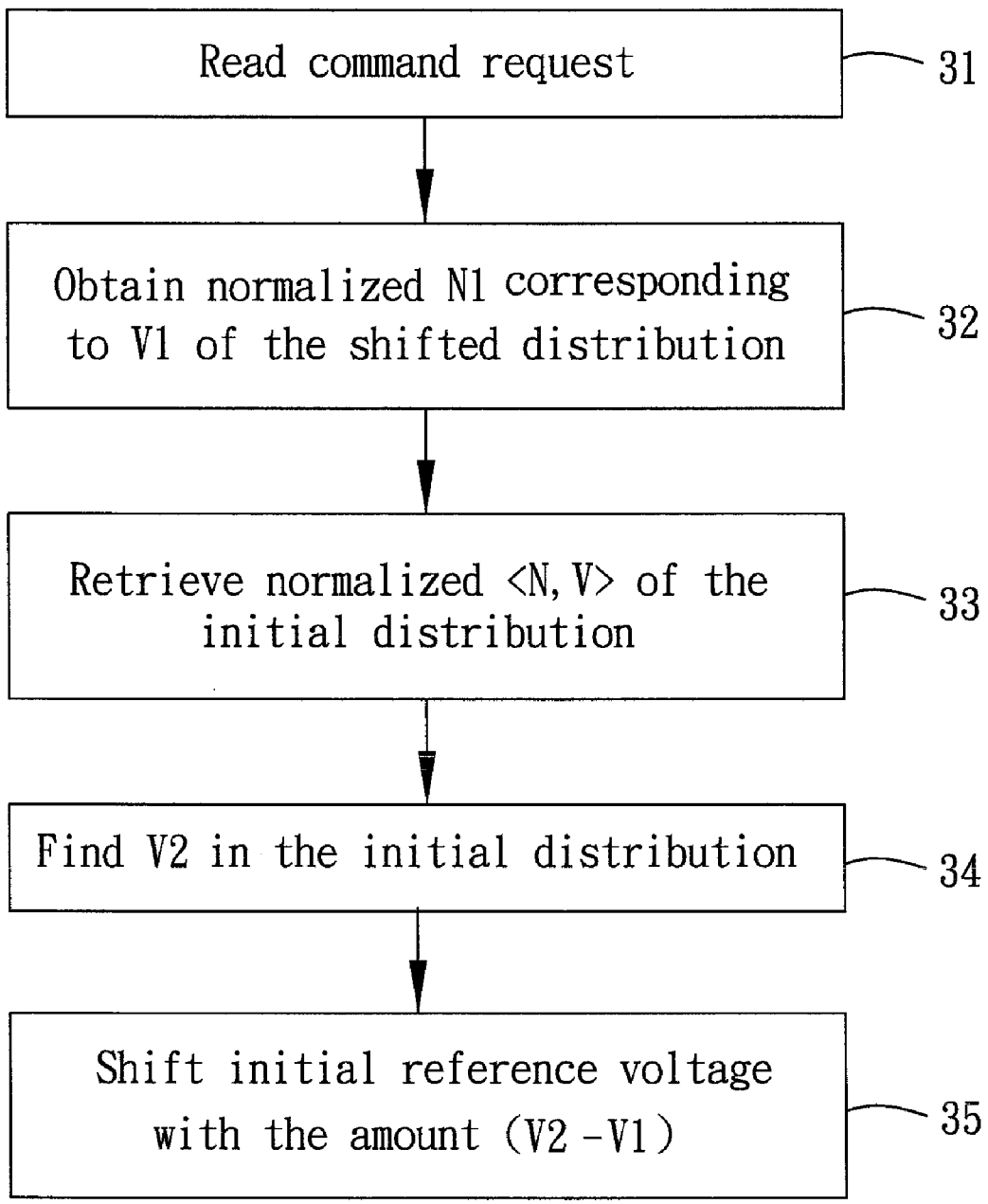
FIG. 3B shows a flow diagram corresponding to the aspect of the first embodiment of FIG. 3A.

FIG. 3A shows an exemplary threshold voltage distribution of a multi-level cell (MLC) flash memory, illustrating the aspect according to the first embodiment of the present invention. FIG. 3B shows a flow diagram corresponding to the aspect of the first embodiment. In FIG. 3A, (solid) curve 300 represents the initial distribution of the threshold voltage of a state of the flash memory. Another (dotted) curve 302 in FIG. 3A represents a threshold voltage distribution after the flash memory has been subject to a predetermined number of program/erase cycles or/and a predetermined data retention time has elapsed. The curve 302 is supposed to shift or drift downward (e.g., leftward in the figure) as shown due to the cycle/retention issue after a long time not going through program/erase cycle. It is noted that only one state is shown while other states are omitted in the figure for brevity.

In the embodiment, after the flash memory is requested by a read command (the step 31), we can get from the flash memory the number of cells (for example, N1) at a threshold voltage (for example, V1). What we can also get from the flash memory is the number of cells of a state or states from a spare area of the flash memory which we store at program phase. If the number of cells at that state is N, the value N1 is normalized (in the step 32) to be N1/N.

Subsequently, in the step 33, normalized <N,V> data of the initial distribution represented by the curve 300 are retrieved. The known normalized <N,V> data is stored beforehand, for example, in a look up table (LUT), where N represents the normalized number of cells and V represents the corresponding threshold voltage.

Next, in the step 34, compare the normalized <N1,V1> of the shifted distribution 302 with the normalized <N,V> of the initial distribution 300 in order to find the threshold voltage V2 in the initial threshold voltage distribution 300 which has a corresponding normalized number N2 of cells approximate the value N1. The search for finding the threshold voltage V2 may utilize a conventional search method. In the embodiment, the term "approximate" may mean that the number to be searched is within a predetermined range of a target value N1, and may include the case in which the searched number is equal to the target value.

Finally, in the step 35, a new reference voltage for reading data from the MLC flash memory due to the cycle/retention issue is obtained by shifting the original reference voltage downward with the amount of the difference of V2 and V1 (i.e., V2−V1). In one exemplary embodiment, all reference voltages are shifted with the same amount V2−V1. In another exemplary embodiment, different reference voltage is shifted with different amount. For example, if the calculated shift amount for the reference voltage V7 is 1 volts, then the shift amount for the reference voltage V6 may be 0.9 volts, and the shift amount for the reference voltage V5 may be 0.8 volts.

Figure 4A:
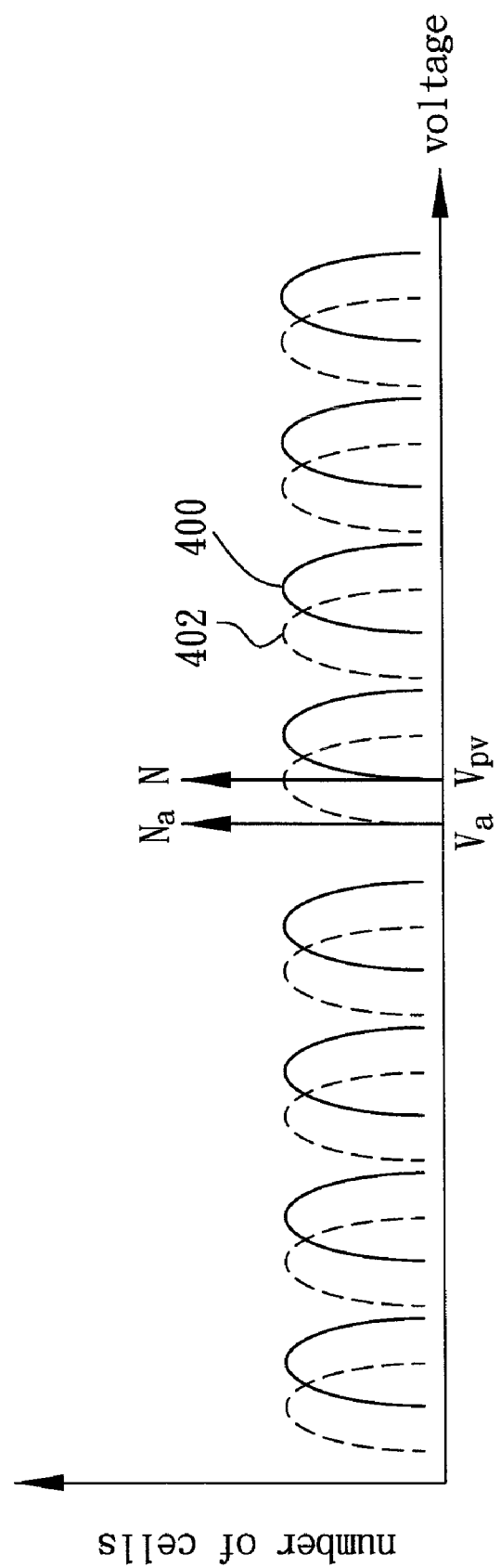
FIG. 4A shows an exemplary threshold voltage distribution of a MLC flash memory, illustrating the aspect according to the second embodiment of the present invention.
Figure 4B:
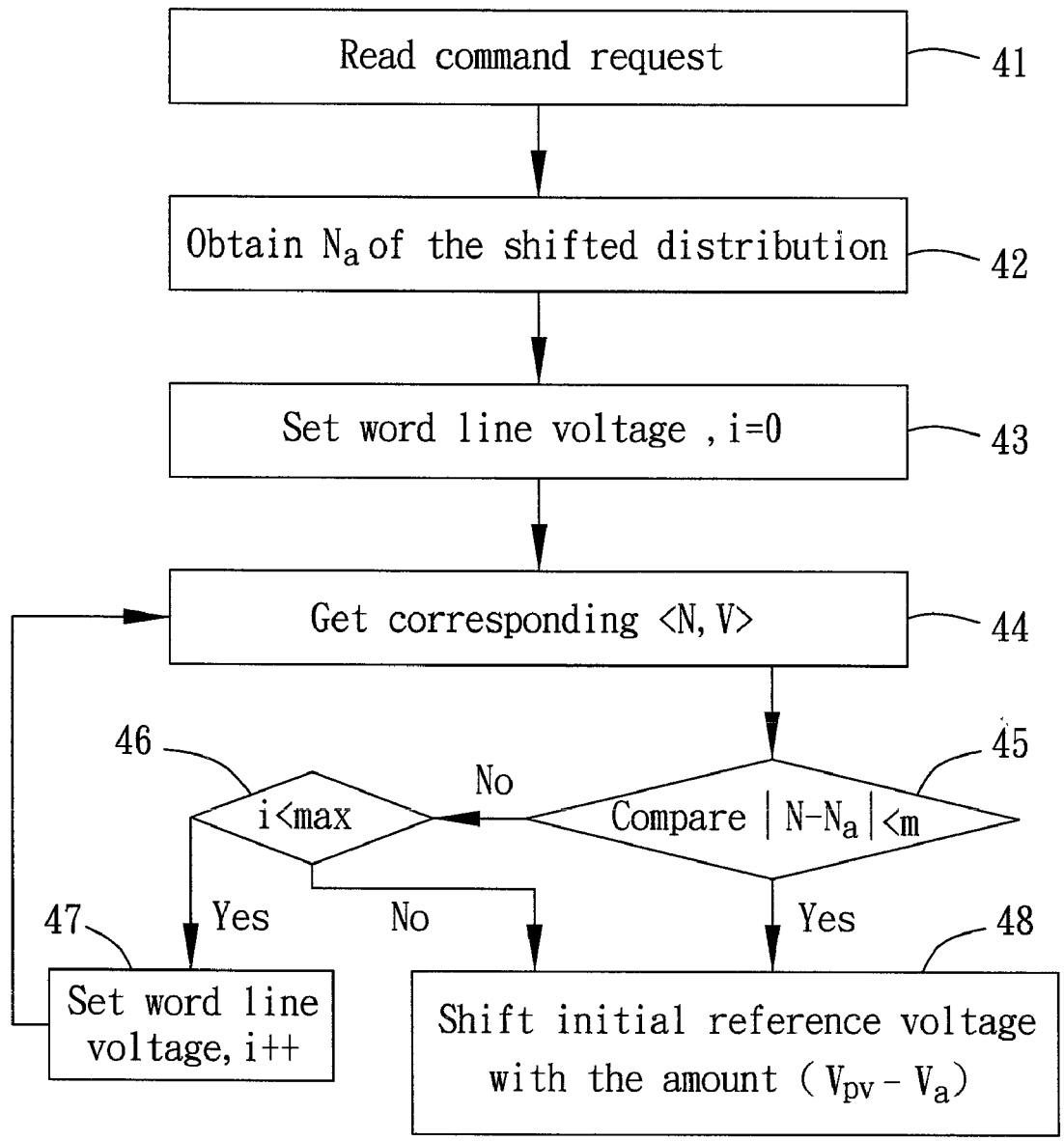
FIG. 4B shows a flow diagram corresponding to the aspect of the second embodiment of FIG. 4A.

FIG. 4A shows an exemplary threshold voltage distribution of a MLC flash memory, illustrating the aspect according to the second embodiment of the present invention. FIG. 4B shows a flow diagram corresponding to the aspect of the second embodiment. In FIG. 4A, (solid) curves 400 represent the initial distribution of the threshold voltage of the states of the flash memory. Another (dotted) curves 402 in the FIG. 4A represent a threshold voltage distribution after the flash memory has been subject to a predetermined number of program/erase cycles or/and a predetermined data retention time has elapsed. The curves 402 are supposed to shift or drift downward (e.g., leftward in the figure) as shown due to the cycle/retention issue after a long time not going through program/erase cycle.

In the embodiment, after the flash memory is requested by a read command (the step 41), the total number Na of the cells above a specific state (e.g., above the threshold voltage Va) of the shifted distribution 402 is obtained (the step 42). Subsequently, search to find a reference state (such as the program verify voltage Vpv in FIG. 4A), above which the total number N of cells is equal or approximate to Na. The search for finding the reference state may be implemented, in the embodiment, by performing the steps 43-48. Specifically speaking, in the step 43, the first (i.e., i=0) word line voltage is set, followed by retrieving known <N,V> data, in which N represents the total number of cells above certain state (the step 44).

Afterwards, the number N is compared with the number Na (the step 45). If the difference (N−Na) is not less than a predetermined value m (such as the acceptable error tolerance) and the maximum world line voltage has not been reached (the step 46), next word line voltage is then set (the step 47). The steps 44-45 iterate until the difference (N−Na) is less than the predetermined m (the step 45) or the maximum world line voltage has been reached (the step 46). At that time, a new reference voltage for reading data from the MLC flash memory due to the cycle/retention issue is obtained by shifting the original reference voltage downward with the amount of the difference of Vpv and Va (i.e., Vpv−Va). In one exemplary embodiment, all reference voltages are shifted with the same amount Vpv−Va. In another exemplary embodiment, different reference voltage is shifted with different amount.

According to the first embodiment (FIG. 3A/B) and the second embodiment (FIG. 4A/B) discussed above, the embodiments of the present invention associate a first threshold voltage (e.g., V2 in FIG. 3A or Vpv in FIG. 4A) in the initial distribution with a second threshold voltage (e.g., V1 in FIG. 3A or Va in FIG. 4A) in a shifted distribution to be determined, such that the information (e.g., the normalized number N1 of cells in FIG. 3A or the total number Na of cells above a state in FIG. 4A) corresponding to the second threshold voltage is approximate to the information corresponding to the first threshold voltage. The difference between the first threshold voltage and the second threshold voltage is then determined and subsequently utilized to correct the reference voltage(s) of the initial threshold voltage distribution due to the cycle/retention issue. It is worthy of noting that, as the effort to obtain the information and determine the difference concerns only basic calculations, the embodiments of the present invention may not only effectively but also economically find proper reference voltages for reading data from a MLC flash memory without much latency.

Figure 5:
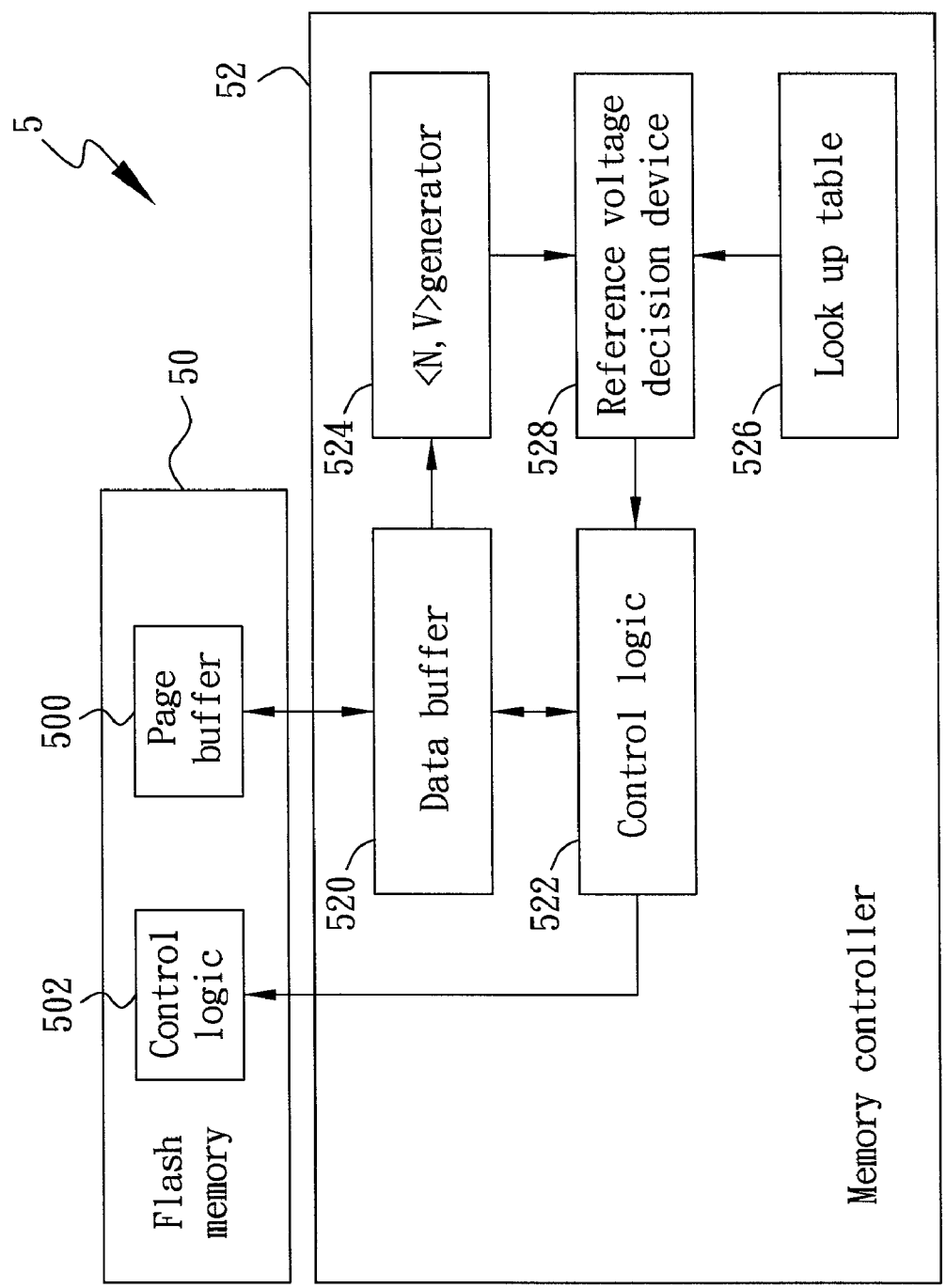
FIG. 5 shows a block diagram illustrating a memory system for adaptively finding proper reference voltages for reading data from a MLC flash memory according to one embodiment of the present invention.

FIG. 5 shows a block diagram illustrating a memory system 5 for adaptively finding proper reference voltages for reading data from a MLC flash memory according to one embodiment of the present invention. The memory system 5 may be adapted to the first embodiment (FIG. 3A/B) or the second embodiment (FIG. 4A/B). The memory system 5 includes a flash memory 50 and a memory controller 52. Data may be written (programmed) to or read from the flash memory 50 from/to a host (not shown) through the memory controller 52. Regarding the flash memory 50, the data being written to or read from the memory cells (not shown) of the flash memory 50 may be temporarily stored in a page buffer 500, and operation and timing of the flash memory 50 is managed by control logic 502. Regarding the memory controller 52, a data buffer 520 is used for temporarily storing data and for interfacing with the flash memory 50, and control logic 522 is used for managing the operation and timing of the memory controller 52.

The memory controller 52 further includes a data pair <N,V> generator 524 that generates the normalized number N1 of cells corresponding to respective threshold voltage V1 (in the first embodiment) or generates the total number Na of cells above respective state (in the second embodiment). The memory controller 52 also includes a reference voltage decision device 528 that associates a first threshold voltage (e.g., V2 in FIG. 3A or Vpv in FIG. 4A) in the initial distribution with a second threshold voltage (e.g., V1 in FIG. 3A or Va in FIG. 4A) in a shifted distribution to be determined, such that the information (e.g., the normalized number N1 of cells in FIG. 3A or the total number Na of cells above a state in FIG. 4A) corresponding to the first threshold voltage is approximate to the information corresponding to the second threshold voltage. The difference between the first threshold voltage and the second threshold voltage is then determined by the reference voltage decision device 528. In addition, what might also be required, for the first embodiment only, is a look up table (LUT) 526 for pre-storing the known normalized <N,V> data of the initial distribution. The amount approximate to the difference is subsequently utilized to correct the initial reference voltage(s) due to the cycle/retention issue. It is appreciated by those skilled in the pertinent technical field that the blocks (500-528) of the memory system 5 may be implemented using hardware technique (such as circuit) or software technique (such as program run on a microcontroller) or their combination.

Although specific embodiments have been illustrated and described, it will be appreciated by those skilled in the art that various modifications may be made without departing from the scope of the present invention, which is intended to be limited solely by the appended claims.

What is claimed is:

1. A method for adaptively finding reference voltages for reading data from a multi-level cell (MLC) flash memory, the method comprising:
    providing given information about an initial threshold voltage distribution;
    associating a first threshold voltage in the initial threshold voltage distribution and a second threshold voltage in a shifted threshold voltage distribution to be determined, such that the information corresponding to the first threshold voltage is approximate to the information corresponding to the second threshold voltage; and
    shifting initial reference voltage or voltages of the initial threshold voltage distribution with an amount approximate to difference between the first threshold voltage and the second threshold voltage, thereby resulting in new reference voltage or voltages for reading the data from the MLC flash memory.

2. The method of claim 1, wherein the information is a normalized number of cells of the flash memory corresponding to the first threshold voltage.

3. The method of claim 1, wherein the information is total number of cells of the flash memory above a reference state corresponding to the first threshold voltage.

4. The method of claim 3, wherein the first threshold voltage is a program verify voltage.

5. A method for adaptively finding reference voltages for reading data from a MLC flash memory, the method comprising:
    providing an initial threshold voltage distribution that includes data pairs <N,V>, each including normalized number N of cells of the flash memory and corresponding threshold voltage V in the initial threshold voltage distribution;
    obtaining normalized number N1 of the cells corresponding to a given threshold voltage V1 in a shifted threshold voltage distribution to be determined;
    searching to find, in the initial threshold voltage distribution, a threshold voltage V2 which has a corresponding normalized number of cells approximate to the normalized number N1; and
    shifting initial reference voltage or voltages of the initial threshold voltage distribution with an amount approximate to difference between the threshold voltage V2 and the given threshold voltage V1, thereby resulting in new reference voltage or voltages for reading the data from the MLC flash memory.

6. The method of claim 5, further comprising a step of subjecting the flash memory to a predetermined number of program or erase cycles or for a predetermined data retention elapsed time.

7. The method of claim 5, wherein the initial threshold voltage distribution is stored in a look up table.

8. A system for adaptively finding reference voltages for reading data from a MLC flash memory, the system comprising:
    a data pair generator for providing information about an initial threshold voltage distribution; and
    a reference voltage decision device that associates a first threshold voltage in the initial threshold voltage distribution and a second threshold voltage in a shifted threshold voltage distribution to be determined, such that the information corresponding to the first threshold voltage is approximate to the information corresponding to the second threshold voltage;
    wherein initial reference voltage or voltages of the initial threshold voltage distribution are then shifted with an amount approximate to difference between the first threshold voltage and the second threshold voltage, thereby resulting in new reference voltage or voltages for reading the data from the MLC flash memory.

9. The system of claim 8, further comprising a look up table (LUT) for storing the initial threshold voltage distribution.

10. The system of claim 8, further comprising a data buffer for storing the data and for interfacing with the flash memory.

11. The system of claim 8, wherein the information is a normalized number of cells of the flash memory corresponding to the first threshold voltage.

12. The system of claim 8, wherein the information is total number of cells of the flash memory above a reference state corresponding to the first threshold voltage.

13. The system of claim 12, wherein the first threshold voltage is a program verify voltage.

* * * * *